United States Patent
Cho

(10) Patent No.: US 9,653,386 B2
(45) Date of Patent: May 16, 2017

(54) COMPACT MULTI-DIE POWER SEMICONDUCTOR PACKAGE

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/515,860

(22) Filed: Oct. 16, 2014

(65) Prior Publication Data

US 2016/0111356 A1    Apr. 21, 2016

(51) Int. Cl.
*H01L 23/495* (2006.01)
*H01L 23/00* (2006.01)
*H01L 25/07* (2006.01)

(52) U.S. Cl.
CPC .. *H01L 23/49562* (2013.01); *H01L 23/49524* (2013.01); *H01L 23/49548* (2013.01); *H01L 23/49575* (2013.01); *H01L 24/33* (2013.01); *H01L 24/48* (2013.01); *H01L 25/072* (2013.01); *H01L 2224/32245* (2013.01); *H01L 2224/33181* (2013.01); *H01L 2224/48106* (2013.01); *H01L 2224/48247* (2013.01); *H01L 2224/73265* (2013.01); *H01L 2924/00014* (2013.01); *H01L 2924/1033* (2013.01); *H01L 2924/10253* (2013.01); *H01L 2924/1306* (2013.01); *H01L 2924/13055* (2013.01); *H01L 2924/13064* (2013.01); *H01L 2924/14252* (2013.01)

(58) Field of Classification Search
CPC ......... H01L 23/49524; H01L 23/49575; H01L 23/49562
See application file for complete search history.

(56) References Cited

U.S. PATENT DOCUMENTS

| 6,624,522 | B2 | 9/2003 | Standing |
| 7,125,747 | B2 | 10/2006 | Lee et al. |
| 7,271,470 | B1 * | 9/2007 | Otremba ............... H01L 23/492 257/666 |

(Continued)

OTHER PUBLICATIONS

Office Action from U.S. Appl. No. 14/515,720, dated Dec. 21, 2016, 20 pp.

(Continued)

*Primary Examiner* — Joshua King
(74) *Attorney, Agent, or Firm* — Shumaker & Sieffert, P.A.

(57) ABSTRACT

One disclosed implementation is a power semiconductor package including a sync transistor having a drain on its top surface and a source and a gate on its bottom surface. The source of the sync transistor is configured for attachment to a first partially etched leadframe segment and the gate of the sync transistor is configured for attachment to a second partially etched leadframe segment. A control transistor has a source and a gate on its top surface and a drain on its bottom surface. The drain of the control transistor is configured for attachment to a third partially etched leadframe segment. A first conductive clip extends to the substrate and is situated over the drain of the sync transistor and the source of the control transistor, the first conductive clip coupling the drain of the sync transistor and the source of the control transistor to the substrate without using a leadframe.

15 Claims, 10 Drawing Sheets

(56) References Cited

U.S. PATENT DOCUMENTS

| | | | |
|---|---|---|---|
| 7,285,849 | B2 | 10/2007 | Cruz |
| 7,301,235 | B2* | 11/2007 | Schaffer .............. H01L 23/5385 |
| | | | 257/724 |
| 7,663,212 | B2* | 2/2010 | Otremba ............... H01L 23/492 |
| | | | 257/678 |
| 7,800,217 | B2* | 9/2010 | Otremba ........... H01L 23/49524 |
| | | | 257/686 |
| 7,804,131 | B2* | 9/2010 | Cheah ............... H01L 23/49524 |
| | | | 257/341 |
| 8,138,585 | B2 | 3/2012 | Liu et al. |
| 8,304,903 | B2 | 11/2012 | Herbsommer et al. |
| 8,680,656 | B1 | 3/2014 | Kuo |
| 8,884,420 | B1* | 11/2014 | Hosseini ........... H01L 23/49575 |
| | | | 257/676 |
| 2004/0061221 | A1* | 4/2004 | Schaffer .................. H01L 24/36 |
| | | | 257/723 |
| 2006/0017174 | A1* | 1/2006 | Otremba ........... H01L 23/49562 |
| | | | 257/778 |
| 2006/0151861 | A1 | 7/2006 | Noquil |
| 2007/0090523 | A1* | 4/2007 | Otremba ............. H01L 23/3121 |
| | | | 257/727 |
| 2007/0114352 | A1 | 5/2007 | Cruz |
| 2009/0224383 | A1 | 9/2009 | Cruz et al. |
| 2010/0133670 | A1 | 6/2010 | Liu |
| 2011/0049690 | A1 | 3/2011 | Cho |
| 2012/0015483 | A1 | 1/2012 | Herbsommer et al. |
| 2012/0181674 | A1* | 7/2012 | Cho .................. H01L 23/49524 |
| | | | 257/666 |
| 2012/0241926 | A1 | 9/2012 | Camacho |
| 2012/0248521 | A1* | 10/2012 | Herbsommer .......... H02M 3/00 |
| | | | 257/299 |
| 2012/0280308 | A1 | 11/2012 | Disney |
| 2012/0292752 | A1* | 11/2012 | Cho .................... H01L 23/3735 |
| | | | 257/675 |
| 2012/0292753 | A1* | 11/2012 | Cho .................. H01L 23/49524 |
| | | | 257/676 |
| 2013/0161801 | A1* | 6/2013 | Otremba ................. H01L 23/24 |
| | | | 257/668 |

OTHER PUBLICATIONS

Response to Office Action dated Dec. 21, 2016, from U.S. Appl. No., filed Feb. 1, 2017, 8 pp.

Notice of Allowance from U.S. Appl. No. 14/515,720, mailed Mar. 13, 2017, 8 pp.

* cited by examiner

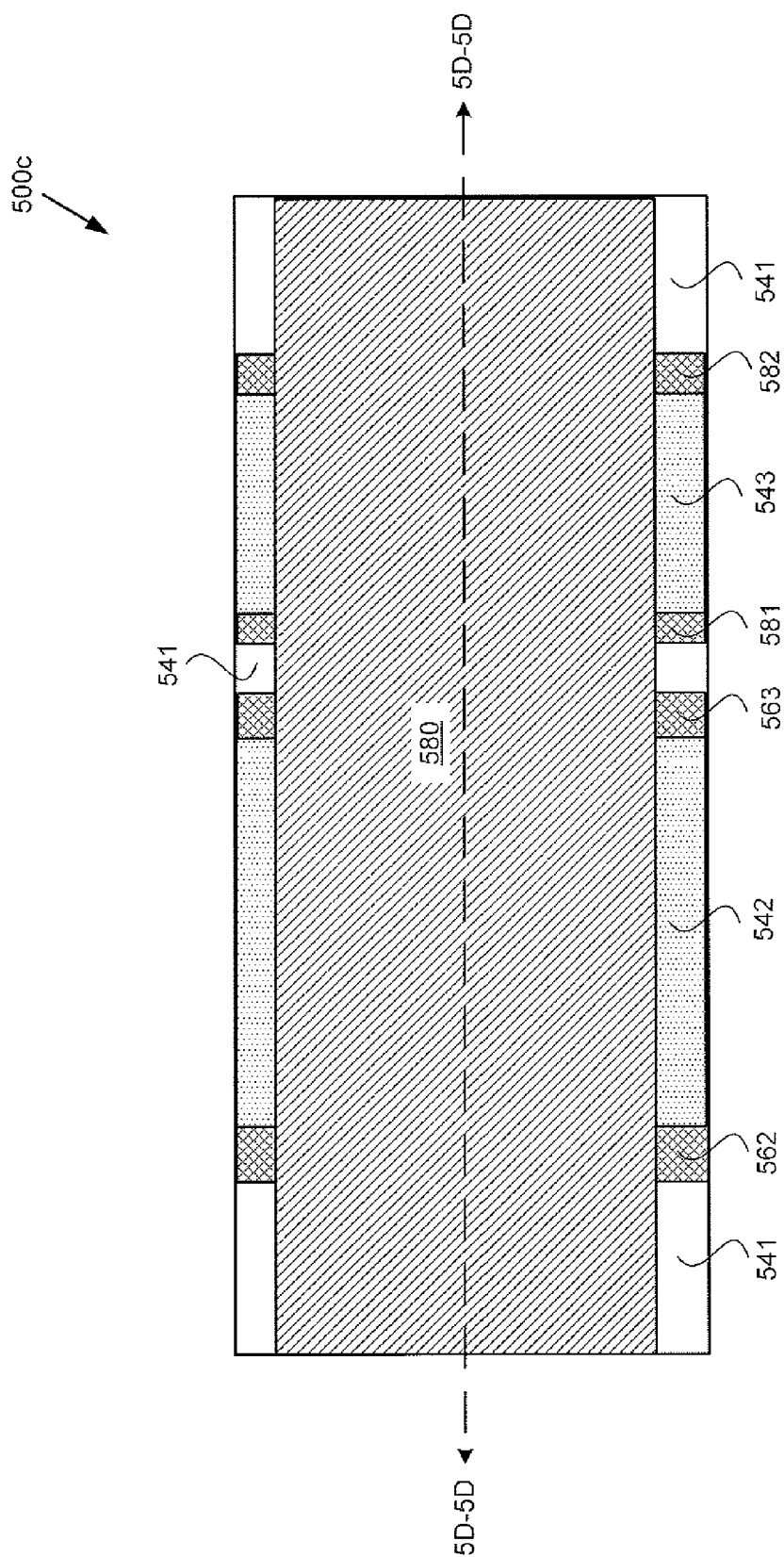

COMPACT MULTI-DIE POWER SEMICONDUCTOR PACKAGE

BACKGROUND

For optimization of form factor, performance, and manufacturing cost, it is often desirable to integrate components of a power circuit, such as a half-bridge based DC-DC converter or a voltage converter, in a single semiconductor package. Thus, several semiconductor package designs have been developed to integrate the power transistors of a power circuit within a compact package. To provide sufficient electrical performance for the reliable operation of high power semiconductor packages, it is crucial to ensure high current carrying capability and low resistance for connection between the transistors of the power circuit.

Various high power semiconductor package designs use multiple leadframes, including leadframes for connecting conductive clips to a substrate, undesirably increasing electrical resistance and reducing current carrying capability. Additionally, package design rules to successfully accommodate multiple leadframes and a conductive clip require a large degree of tolerance (i.e. a large clearance space) for manufacturing, thus undesirably increasing package form factor and complexity. For example, package height and width have to be increased to provide sufficient space for the multiple leadframes and a conductive clip, and additional area on the package may be reserved for necessary electrical connections. Additionally, the increased package complexity resulting from the use of multiple leadframes and a conductive clip may negatively affect manufacturing time, cost, and package yields.

SUMMARY

A compact multi-die power semiconductor package, substantially as shown in and/or described in connection with at least one of the figures, and as set forth more completely in the claims.

BRIEF DESCRIPTION OF THE DRAWINGS

FIG. 5C illustrates a top view of an exemplary power semiconductor package, in accordance with one implementation of the present disclosure.

DETAILED DESCRIPTION

Figure 1:
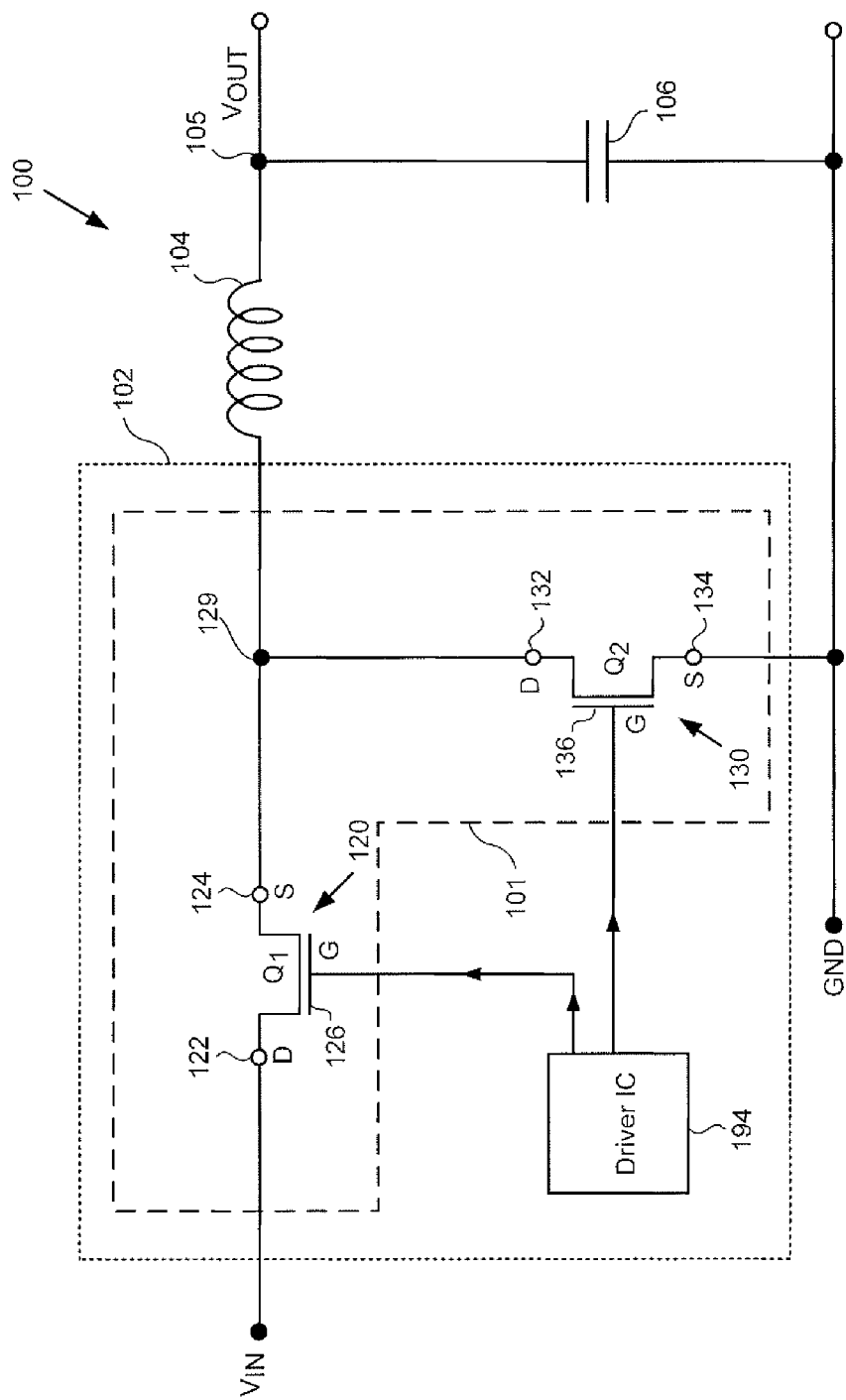
FIG. 1 illustrates a diagram of an exemplary circuit suitable for use as a voltage converter.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The drawings in the present application and their accompanying detailed description are directed to merely exemplary implementations of the present disclosure. To maintain brevity, other implementations of the present disclosure, which use the principles of the present inventive concepts, are not specifically described in the present application and are not specifically illustrated by the present drawings.

Voltage converters are used in a variety of electronic circuits and systems. For example, various applications may require conversion of a direct current (DC) input to a lower, or higher, DC output. As a specific example, a buck converter may be implemented as a voltage regulator to convert a higher voltage DC input to a lower voltage DC output for use in low voltage applications.

FIG. 1 illustrates a diagram of an exemplary circuit suitable for use as a voltage converter. Voltage converter 100 includes voltage converter multi-chip module (MCM) 102, output inductor 104, and output capacitor 106. As shown in FIG. 1, MCM 102 includes power switching stage 101 of voltage converter 100, and driver IC 194 implemented to provide drive signals to power switching stage 101. As shown in FIG. 1, voltage converter 100 is configured to receive an input voltage $V_{IN}$, and to provide a converted voltage, e.g., a rectified and/or stepped down voltage, as $V_{OUT}$ at output 105.

Power switching stage 101 may be implemented using two power transistors in the form of metal-oxide-semiconductor field-effect transistors (MOSFETs) configured as a half bridge, for example. That is to say, power switching stage 101 may include high side or control transistor 120 ($Q_1$) having drain 122, source 124, and gate 126, as well as low side or sync transistor 130 ($Q_2$) having drain 132, source 134, and gate 136. Control transistor 120 is coupled to sync transistor 130 at switch node 129, which, in turn, is coupled to output 105 through output inductor 104. Respective control and sync transistors 120 and 130 may be implemented as field-effect transistors (FETs), insulated gate bipolar transistors (IGBTs), or high electron mobility transistors (HEMTs), for example. More specifically, respective control and sync transistors 120 and 130 may be implemented as silicon FETs or gallium nitride (GaN) FETs. Voltage converter 100 may be advantageously used, for example as a buck converter, in a variety of automotive, industrial, appliance, and lighting applications.

Figure 2:
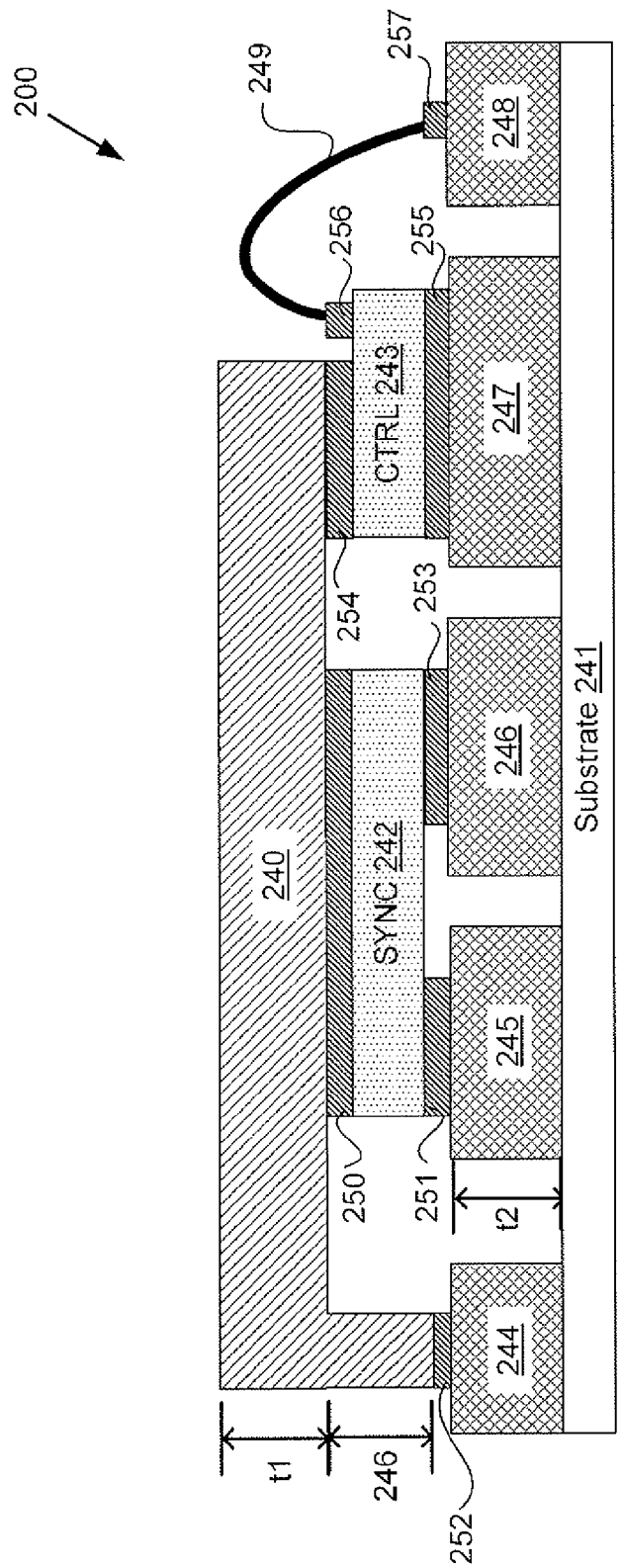
FIG. 2 illustrates a cross-sectional view of a power semiconductor package.
Figure 3:
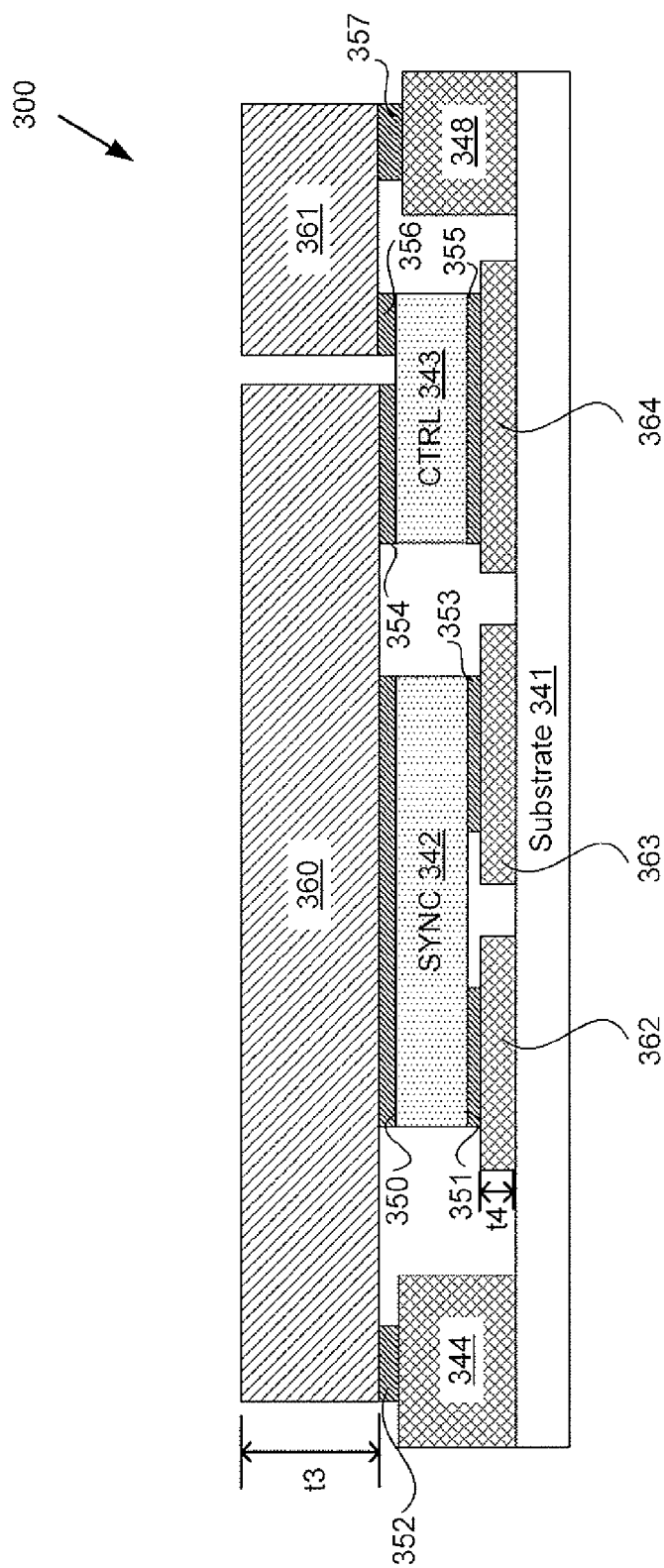
FIG. 3 illustrates a cross-sectional view of another power semiconductor package.
Figure 4A:
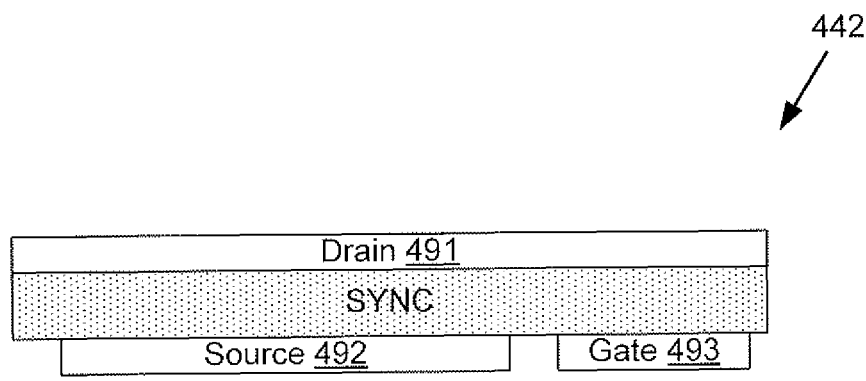
FIG. 4A illustrates a cross-sectional view of a power transistor for use in a power semiconductor package.
Figure 4B:
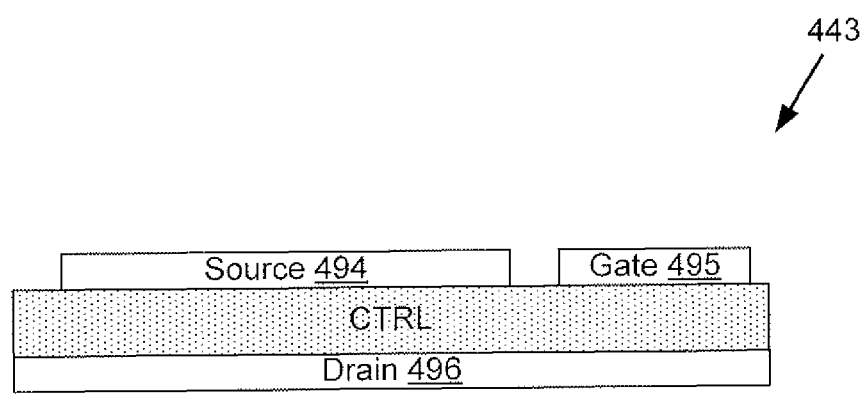
FIG. 4B illustrates a cross-sectional view of another power transistor for use in a power semiconductor package.
Figure 4C:
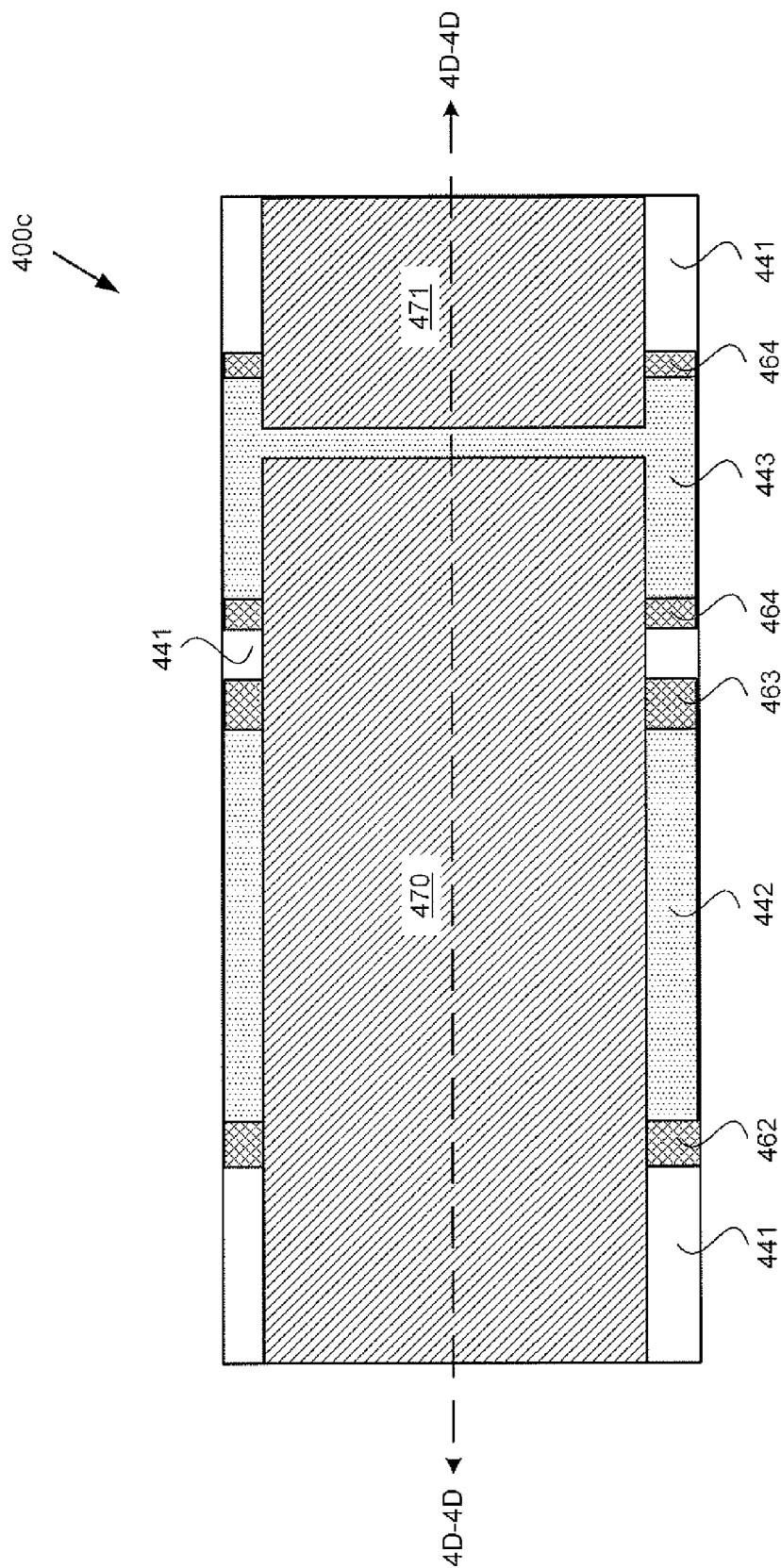
FIG. 4C illustrates a top view of an exemplary power semiconductor package, in accordance with one implementation of the present disclosure.
Figure 4D:
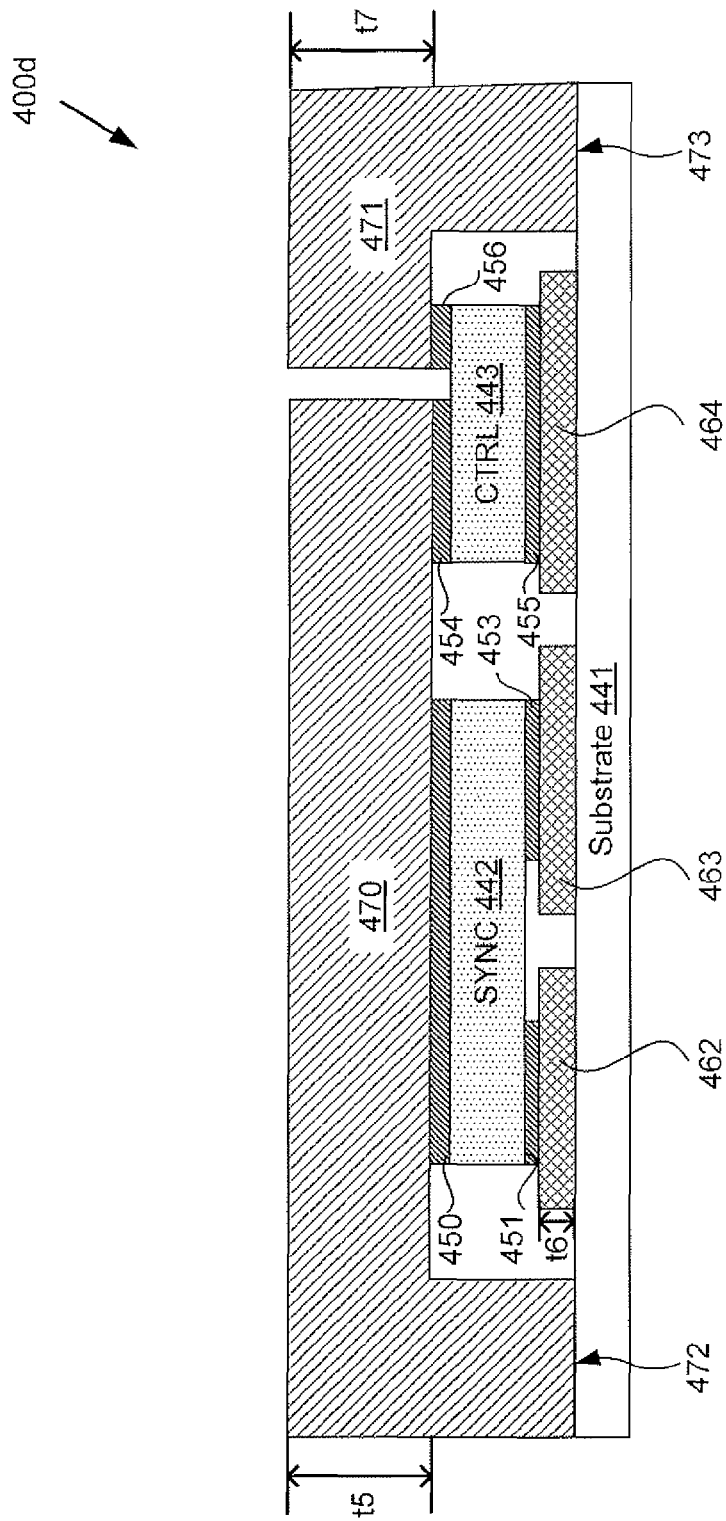
FIG. 4D illustrates a cross-sectional view of the exemplary power semiconductor package of FIG. 4C, in accordance with one implementation of the present disclosure.
Figure 4E:
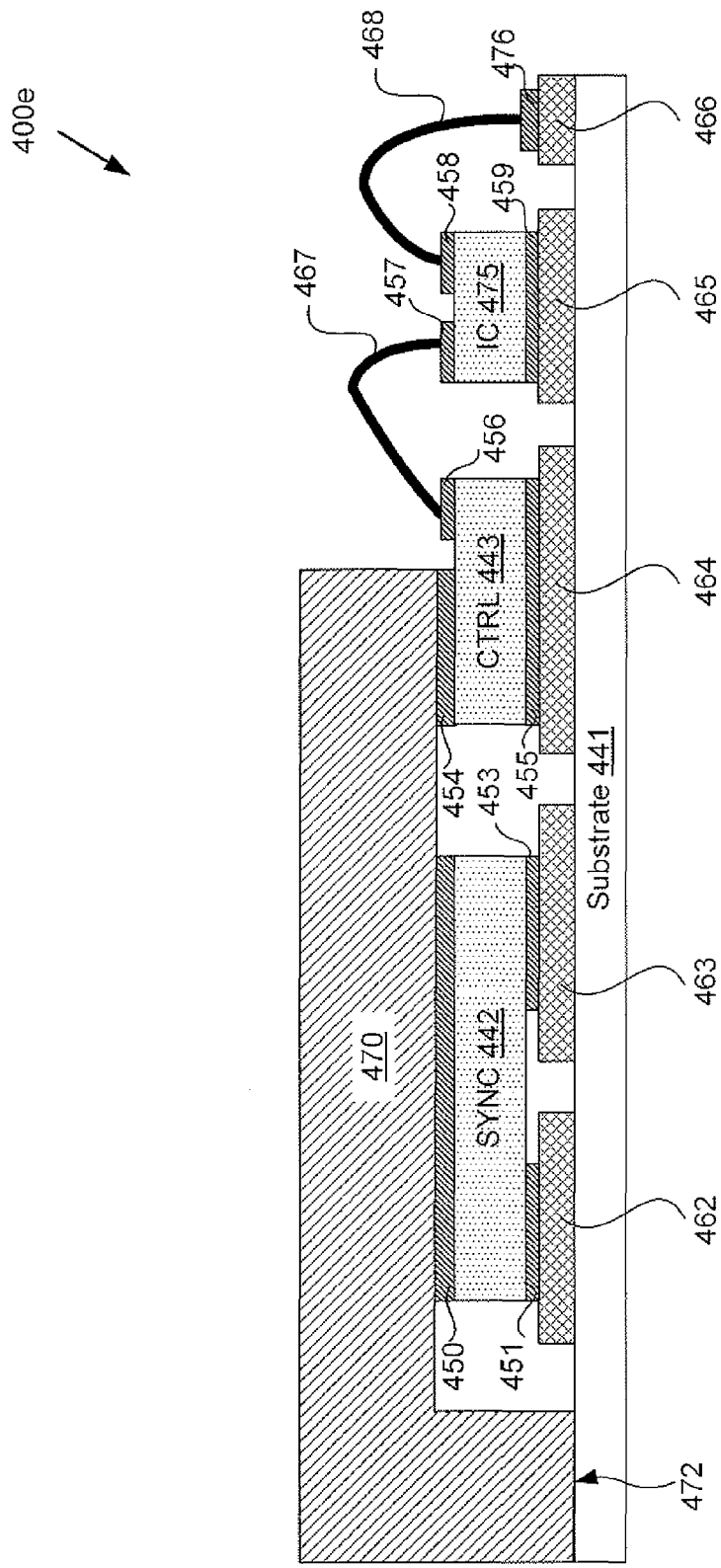
FIG. 4E illustrates a cross-sectional view of an exemplary power semiconductor package, in accordance with one implementation of the present disclosure.
Figure 5A:
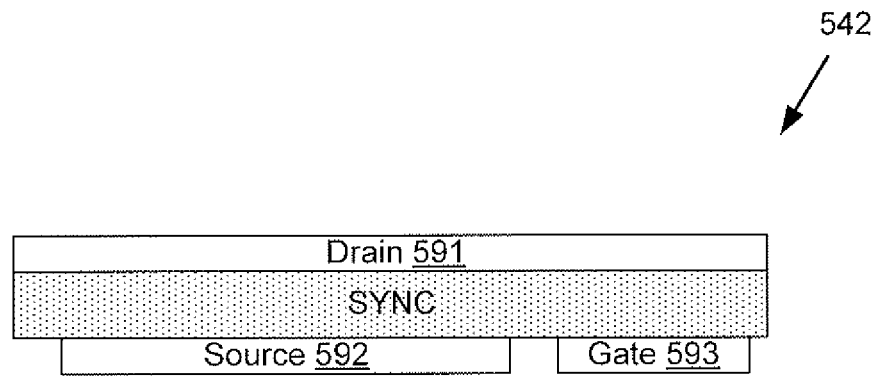
FIG. 5A illustrates a cross-sectional view of a power transistor for use in a power semiconductor package.
Figure 5B:
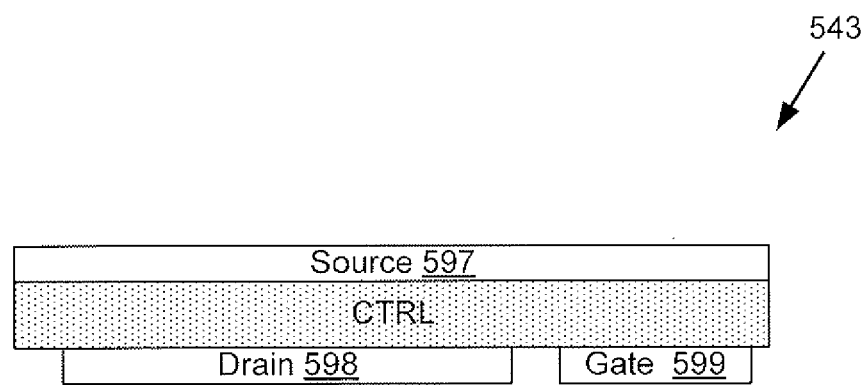
FIG. 5B illustrates a cross-sectional view of another power transistor for use in a power semiconductor package.
Figure 5D:
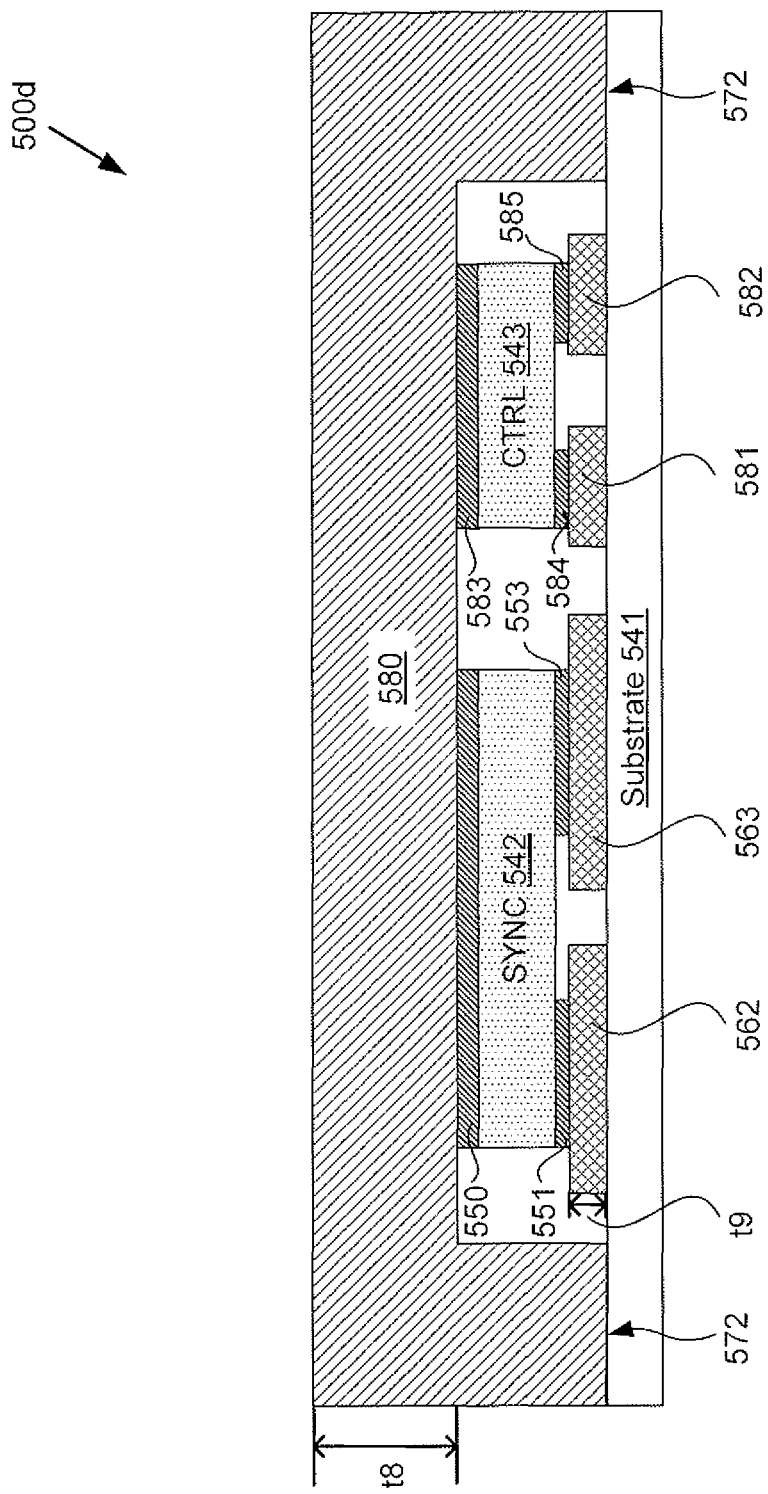
FIG. 5D illustrates a cross-sectional view of the exemplary power semiconductor package of FIG. 5C, in accordance with one implementation of the present disclosure.

It should be noted with reference to FIG. 2, FIG. 3, FIG. 4C, FIG. 4D, FIG. 4E, FIG. 5C, and FIG. 5D, that implementations of the present disclosure are described with respect to two power transistors within a power semiconductor package, such as sync transistor 242 and control transistor 243 within power semiconductor package 200 of FIG. 2, sync transistor 342 and control transistor 343 within power semiconductor package 300 of FIG. 3, sync transistor 442 and control transistor 443 within power semiconductor packages 400c, 400d, and 400e of FIG. 4C, FIG. 4D, and FIG. 4E, and sync transistor 442 and control transistor 543 within power semiconductor packages 500c and 500d of FIG. 5C and FIG. 5D. Each sync transistor 242, sync transistor 342, sync transistor 442, and sync transistor 542 may correspond to sync transistor 130 of FIG. 1. Each control transistor 243, control transistor 343, control transistor 443, and control transistor 543 may correspond to control transistor 120 of FIG. 1.

As another example, the sync and control transistors shown in various power semiconductor packages referred to above, such as sync transistor 242 and control transistor 243 within power semiconductor package 200 of FIG. 2, sync transistor 342 and control transistor 343 within power semiconductor package 300 of FIG. 3, sync transistor 442 and control transistor 443 within power semiconductor packages 400c, 400d, and 400e of FIG. 4C, FIG. 4D, and FIG. 4E, and sync transistor 542 and control transistor 543 within power semiconductor packages 500c and 500d of FIG. 5C and FIG. 5D, may be electrically coupled to a driver IC, an output inductor, and an output capacitor, such as driver IC 194, output inductor 104, and output capacitor 106 of FIG. 1, according to the exemplary voltage converter 100 of FIG. 1.

FIG. 2 illustrates a cross-sectional view of a power semiconductor package. Power semiconductor package 200 includes conductive clip 240, leadframe segment 244, leadframe segment 245, leadframe segment 246, leadframe segment 247, leadframe segment 248, sync transistor 242, control transistor 243, conductive adhesive 250, conductive adhesive 251, conductive adhesive 252, conductive adhesive 253, conductive adhesive 254, conductive adhesive 255, conductive adhesive 256, conductive adhesive 257, wire bond 249, and substrate 241.

Conductive clip 240 of power semiconductor package 200 is configured to electrically couple a power electrode situated on top of sync transistor 242 and a power electrode situated on a top of control transistor 243 to leadframe segment 244. Conductive clip 240 is situated over sync transistor 242 and electrically and mechanically coupled to sync transistor 242 by conductive adhesive 250. Conductive clip 240 is situated over control transistor 243 and electrically and mechanically coupled to control transistor 243 by conductive adhesive 254. Leg portion 246 of conductive clip 240 is electrically and mechanically coupled to leadframe segment 244 by conductive adhesive 252.

Conductive clip 240 has thickness t1 that is dependent on the current carrying capability needs of the particular implementation. For example, in some implementations, the current carrying capability needs may be high, resulting in a greater thickness t1 of conductive clip 240 and consequently a greater overall height of power semiconductor package 200.

Leadframe segment 244 of power semiconductor package 200 is configured to couple conductive clip 240 to substrate 241. Leadframe segment 244 is electrically and mechanically coupled to conductive clip 240 using conductive adhesive 252. Leadframe segment 244 is also electrically and mechanically coupled to substrate 241 using a leadframe pad or a conductive adhesive, for example.

Leadframe segment 244, as illustrated in FIG. 2, must generally be wider than leg portion 246 of conductive clip 240 in order to account for manufacturing tolerances. For example, because conductive adhesive 252 may spill over and/or extend beyond the width of leg portion 246 of conductive clip 240, leadframe segment 244 must be wider than leg portion 246 of conductive clip 240 in order to account for the spill over and/or extension. In addition, leadframe segment 244 must be wider than leg portion 246 of conductive clip 240 to account for misalignment of conductive clip 240 during attachment to leadframe segment 244 during manufacturing. As a result of the increased width of leadframe segment 244, the overall width and form factor of power semiconductor package 200 is increased, requiring more space on substrate 241.

Leadframe segment 245 of power semiconductor package 200 is configured to couple at least one power electrode of sync transistor 242 to substrate 241. Leadframe segment 245 is electrically and mechanically coupled to sync transistor 242 by conductive adhesive 251. Leadframe segment 245 is also electrically and mechanically coupled to substrate 241 using a leadframe pad or a conductive adhesive, for example.

Leadframe segment 246 of power semiconductor package 200 is configured to couple a gate electrode of sync transistor 242 to substrate 241. Leadframe segment 246 is electrically and mechanically coupled to sync transistor 242 by conductive adhesive 253. Leadframe segment 246 is also electrically and mechanically coupled to substrate 241 using a leadframe pad or a conductive adhesive, for example.

Leadframe segment 247 of power semiconductor package 200 is configured to couple at least one power electrode of control transistor 243 to substrate 241. Leadframe segment 247 is electrically and mechanically coupled to control transistor 243 by conductive adhesive 255. Leadframe segment 247 is also electrically and mechanically coupled to substrate 241 using a leadframe pad or a conductive adhesive, for example.

Leadframe segment 248 of power semiconductor package 200 is configured to couple a gate electrode of control transistor 243 to substrate 241. Leadframe segment 248 is electrically coupled to control transistor 243 by wire bond 249 using conductive adhesive 256 and conductive adhesive 257. Leadframe segment 248 is also electrically and mechanically coupled to substrate 241 using a leadframe pad or a conductive adhesive, for example.

Leadframe segment 245, leadframe segment 246, and leadframe segment 247 have substantially the same thickness t2. Thickness t2 is dependent on a number of factors. Thickness t2 must allow for mechanical and electrical coupling between sync transistor 242 and conductive clip 240 as well as mechanical and electrical coupling between control transistor 243 and conductive clip 240. In addition, thickness t2 must allow for mechanical and electrical coupling between sync transistor 242 and each of leadframe segment 245 and leadframe segment 246 along with mechanical and electrical coupling between control transistor 243 and leadframe segment 247. Furthermore, because leg portion 246 of conductive clip 240 increases the overall height of conductive clip 240 within power semiconductor package 200, thickness t2 must increase in order to ensure sync transistor 242 and control transistor 243 are mechanically and electrically coupled to conductive clip 240. As a result, thickness t2 of leadframe segment 245, leadframe segment 246, and leadframe segment 247 is increased resulting in an increased overall size of power semiconductor package 200.

FIG. 3 illustrates a cross-sectional view of another power semiconductor package. Power semiconductor package 300 includes top leadframe segment 360, top leadframe segment 361, leadframe segment 344, leadframe segment 348, partially etched leadframe segment 362, partially etched leadframe segment 363, partially etched leadframe segment 364, sync transistor 342, control transistor 343, conductive adhesive 350, conductive adhesive 351, conductive adhesive 352, conductive adhesive 353, conductive adhesive 354, conductive adhesive 355, conductive adhesive 356, conductive adhesive 357, and substrate 341.

Top leadframe segment 360 of power semiconductor package 300 is configured to electrically and mechanically couple a power electrode situated on top of sync transistor 342 and a power electrode situated on top of control transistor 343 to leadframe segment 344. Top leadframe segment 360 is situated over sync transistor 342 and electrically and mechanically coupled to sync transistor 342 by conductive adhesive 350. Top leadframe segment 360 is also situated over control transistor 343 and electrically and mechanically coupled to control transistor 343 by conductive adhesive 354. Top leadframe segment 360 is electrically and mechanically coupled to leadframe segment 344 by conductive adhesive 352.

Top leadframe segment 360 has thickness t3 that is dependent on the current carrying capability needs of the particular implementation. For example, in some implementations, the current carrying capability needs may be high, resulting in a greater thickness t3 of top leadframe segment 360. Comparing conductive clip 240 of semiconductor package 200 to top leadframe segment 360 of semiconductor package 300, thickness t3 of top leadframe segment 360 can be greater than thickness t1 of conductive clip 240, thus providing a better current carrying capability than that provided by semiconductor package 200, while preserving the same height and form factor as semiconductor package 200. Thickness t3 can be greater than thickness t1 due to thickness t4 of partially etched leadframe segment 362, partially etched leadframe segment 363, and partially etched leadframe segment 364 of semiconductor package 300 being less than thickness t2 of leadframe segment 245, leadframe segment 246, and leadframe segment 247 of semiconductor package 200 (partially etched leadframe segment 362, partially etched leadframe segment 363, and partially etched leadframe segment 364 will be described in greater detail below).

Thus, as a result of thickness t4 being less than thickness t2, thickness t3 of top leadframe segment 360 can be increased, directly increasing the current carrying capability of top leadframe segment 360 without increasing the overall package height of power semiconductor package 300 compared to power semiconductor package 200 of FIG. 2. More specifically, the space increase within power semiconductor package 300 due to thickness t4 being less than thickness t2 is used to increase thickness t3 of top leadframe segment 360. In such an implementation, the size of power semiconductor package 300 can be decreased compared to power semiconductor package 200 while concurrently increasing the current carrying capability of top leadframe segment 360 compared to the current carrying capability of conductive clip 240.

Top leadframe segment 361 of power semiconductor package 300 is configured to electrically and mechanically couple a gate electrode situated on top of control transistor 343 to leadframe segment 348. Top leadframe segment 361 is situated over control transistor 343 and electrically and mechanically coupled to control transistor 343 by conductive adhesive 356. Top leadframe segment 361 is electrically and mechanically coupled to leadframe segment 348 by conductive adhesive 357. Top leadframe segment 361 has substantially the same thickness t3 as top leadframe segment 360 and consequently has similar performance benefits as top leadframe segment 360.

Leadframe segment 344 of power semiconductor package 300 is configured to couple top leadframe segment 360 to substrate 341. Leadframe segment 344 is electrically and mechanically coupled to top leadframe segment 360 using conductive adhesive 352. Leadframe segment 344 is also electrically and mechanically coupled to substrate 341 using a leadframe pad or a conductive adhesive, for example.

Leadframe segment 348 of power semiconductor package 300 is configured to couple top leadframe segment 361 to substrate 341. Leadframe segment 348 is electrically and mechanically coupled to top leadframe segment 361 using conductive adhesive 357. Leadframe segment 348 is also electrically and mechanically coupled to substrate 341 using a leadframe pad or a conductive adhesive, for example.

As illustrated in FIG. 3, Leadframe segment 344 must generally be wider than the desired width of conductive adhesive 352 and leadframe segment 348 must generally be wider than the desired width of conductive adhesive 357 in order to account for manufacturing tolerances. For example, because conductive adhesive 352 and conductive adhesive 357 may spill over and/or extend beyond the width desired, leadframe segment 344 and leadframe segment 348 must be wider in order to account for the spill over and/or extension. In addition, leadframe segment 344 must be wider than conductive adhesive 352 to account for misalignment of top leadframe segment during attachment to leadframe segment 344 during manufacturing. Similarly, leadframe segment 348 must be wider than conductive adhesive 357 to account for misalignment of top leadframe segment 361 during attachment to leadframe segment 348 during manufacturing. As a result of the increased width of leadframe segment 344 and leadframe segment 348 more space on substrate 341 is required, subsequently requiring an increase in the overall width and form factor of power semiconductor package 300.

Partially etched leadframe segment 362 of power semiconductor package 300 is configured to couple at least one power electrode of sync transistor 342 to substrate 341. Partially etched leadframe segment 362 is electrically and mechanically coupled to sync transistor 342 by conductive adhesive 351. Partially etched leadframe segment 362 is also electrically and mechanically coupled to substrate 341 using a leadframe pad or a conductive adhesive, for example.

Partially etched leadframe segment 363 of power semiconductor package 300 is configured to couple a gate electrode of sync transistor 342 to substrate 341. Partially etched leadframe segment 363 is electrically and mechanically coupled to sync transistor 342 by conductive adhesive 353. Partially etched leadframe segment 363 is also electrically and mechanically coupled to substrate 341 using a leadframe pad or a conductive adhesive, for example.

Partially etched leadframe segment 364 of power semiconductor package 300 is configured to couple at least one power electrode of control transistor 343 to substrate 341. Partially etched leadframe segment 364 is electrically and mechanically coupled to control transistor 343 by conductive adhesive 355. Partially etched leadframe segment 364 is also electrically and mechanically coupled to substrate 341 using a leadframe pad or a conductive adhesive, for example.

Partially etched leadframe segment 362, partially etched leadframe segment 363, and partially etched leadframe segment 364 all have substantially the same thickness t4 that is dependent on a number of factors. Thickness t4 must allow for mechanical and electrical coupling between sync transistor 342 and top leadframe segment 360, between control transistor 343 and top leadframe segment 360, and between control transistor 343 and top leadframe segment 361. Thickness t4 must also allow for mechanical and electrical coupling between sync transistor 342 and partially etched leadframe segment 362, between sync transistor 342 and partially etched leadframe segment 363, and between control transistor 343 and partially etched leadframe segment 364.

As illustrated in FIGS. 3 and 2 and as described above, thickness t4 of partially etched leadframe segment 362, partially etched leadframe segment 363, and partially etched leadframe segment 364 is less than thickness t2 of leadframe segment 245, leadframe segment 246, and leadframe segment 247. As a result, thickness t3 of top leadframe segment 360 and top leadframe segment 361 can be increased compared to thickness t1 of conductive clip 240, resulting in a higher current carrying capability. Additionally, thickness t4 allows for a reduction in the overall package height of power semiconductor package 300 compared to power semiconductor package 200 of FIG. 2.

FIG. 4A illustrates a simplified cross-sectional view of a power transistor for use in a power semiconductor package. Sync transistor 442 of FIG. 4A includes drain 491, source 492, and gate 493. Drain 491 is a power electrode situated on a top surface of sync transistor 442. Source 492 is a power electrode situated on a bottom surface of sync transistor 442. Gate 493 is a gate electrode situated on the bottom surface of sync transistor 442. In some implementations, sync transistor 442 of FIG. 4C, FIG. 4D, and FIG. 4E discussed below has the same drain, source, and gate configuration of sync transistor 442 of FIG. 4A. However, the present disclosure is not limited to the implementation of FIG. 4A. For example, in one implementation, the configuration of source 492 and gate 493 of sync transistor 442 may be reversed.

FIG. 4B illustrates a simplified cross-sectional view of another power transistor for use in a power semiconductor package. Control transistor 443 of FIG. 4B includes source 494, gate 495, and drain 496. Source 494 is a power electrode situated on a top surface of control transistor 443. Drain 496 is a power electrode situated on a bottom surface of control transistor 443. Gate 495 is a gate electrode situated on the top surface of control transistor 443. In some implementations, control transistor 443 of FIG. 4C, FIG. 4D, and FIG. 4E discussed below has the same drain, source, and gate configuration of control transistor 443 of FIG. 4B. However, the present disclosure is not limited to the implementation of FIG. 4B. For example, in one implementation, gate 495 may be situated on the bottom surface of control transistor 443.

FIG. 4C illustrates a top view of an exemplary power semiconductor package, in accordance with one implementation of the present disclosure. Power semiconductor package 400c of FIG. 4C includes partially etched leadframe segment 462, partially etched leadframe segment 463, partially etched leadframe segment 464, sync transistor 442, control transistor 443, first conductive clip 470, second conductive clip 471, and substrate 441.

First conductive clip 470 of power semiconductor package 400c is configured to couple sync transistor 442 and control transistor 443 to substrate 441 without using a leadframe. More specifically, first conductive clip 470 is configured to couple a drain electrode of sync transistor 442 and a source electrode of control transistor 443 to substrate 441. First conductive clip 470 is situated on a top surface of sync transistor 442 and control transistor 443. First conductive clip 470 may be electrically and mechanically coupled to sync transistor 442, control transistor 443, and substrate 441 using conductive adhesive such as solder, for example.

Additionally, first conductive clip 470 may cover more or less surface area of sync transistor 442 and control transistor 443 than illustrated in FIG. 4C depending on the thermal and current carrying capability requirements of power semiconductor package 400c. In addition, first conductive clip 470 may have a rectangular shape, as illustrated in FIG. 4C, or may have another suitable shape to maximize surface area within power semiconductor package 400c.

Second conductive clip 471 of power semiconductor package 400c is configured to couple control transistor 443 to substrate 441 without using a leadframe. More specifically, second conductive clip 471 is configured to couple a gate electrode of control transistor 443 to substrate 441. Second conductive clip 471 is situated on the top surface of control transistor 443. Second conductive clip 471 may be electrically and mechanically coupled to control transistor 443 and substrate 441 using conductive adhesive such as solder, for example.

Additionally, second conductive clip 471 may cover more or less surface area of control transistor 443 than illustrated in FIG. 4C depending on the thermal and current carrying capability requirements of power semiconductor package 400c. In addition, second conductive clip 471 may have a rectangular shape, as illustrated in FIG. 4C, or may have another suitable shape to maximize surface area within power semiconductor package 400c.

FIG. 4D illustrates a cross-sectional view of the exemplary power semiconductor package of FIG. 4C, in accordance with one implementation of the present disclosure. More specifically, FIG. 4D illustrates a cross-sectional view of power semiconductor package 400c along dashed line 4D-4D. Power semiconductor package 400d of FIG. 4D includes each feature of power semiconductor package 400c of FIG. 4C and further includes conductive adhesive 450, conductive adhesive 451, conductive adhesive 453, conductive adhesive 454, conductive adhesive 455, and conductive adhesive 456.

As stated above in reference to power semiconductor package 400c, first conductive clip 470 is configured to couple the drain electrode of sync transistor 442 and the source electrode of control transistor 443 to substrate 441 without using a leadframe. First conductive clip 470 is configured to be electrically and mechanically coupled to sync transistor 442 using conductive adhesive 450. First conductive clip 470 is situated over and mechanically and electrically coupled to the drain electrode of sync transistor 442. First conductive clip 470 is configured to be electrically and mechanically coupled to control transistor 443 using conductive adhesive 454. First conductive clip 470 is situated over and mechanically and electrically coupled to the source electrode of control transistor 443. First conductive clip 470 is further configured to be electrically and mechanically coupled to substrate 441. First conductive clip 470 may include a metal such as copper, a metal alloy, or another highly conductive material.

As stated above in reference to power semiconductor package 400c, second conductive clip 471 is configured to couple the gate electrode of control transistor 443 to substrate 441 without using a leadframe. Second conductive clip 471 is configured to be electrically and mechanically coupled to control transistor 443 using conductive adhesive 456. Second conductive clip 471 is situated over and mechanically and electrically coupled to the gate electrode of control transistor 443. Second conductive clip 471 is further configured to be electrically and mechanically coupled to substrate 441. Second conductive clip 471 may include a metal such as copper, a metal alloy, or another highly conductive material. In some implementations, second conductive clip 471 may be replaced with a wire bond.

As illustrated in FIG. 4D, first conductive clip 470 and second conductive clip 471 extend to substrate 441 without using a leadframe. More specifically, bottom surface 472 of first conductive clip 470 and bottom surface 473 of second conductive clip 471 are mechanically and electrically coupled to substrate 441 using a conductive adhesive, a conductive pad, or another suitable attachment material, for example.

Moreover, power semiconductor package 400d, including first conductive clip 470 and second conductive clip 471, provides several advantages over power semiconductor package 200 of FIG. 2 and power semiconductor package 300 of FIG. 3. First conductive clip 470 and second conductive clip 471 do not require an extra conductive adhesive or an additional leadframe, such as conductive adhesive 252, conductive adhesive 257, leadframe segment 244, and leadframe segment 248 of power semiconductor package 200 or conductive adhesive 352, conductive adhesive 357, leadframe segment 344, and leadframe segment 348 of power semiconductor package 300. As a result, manufacturing costs, complexity, and time for power semiconductor package 400d are reduced. In addition, no manufacturing tolerance is required for the application of a conductive adhesive on a leadframe, thus reducing the overall width of power semiconductor package 400d compared to power semiconductor package 200 and power semiconductor package 300.

Additionally, because first conductive clip 470 and second conductive clip 471 extend to substrate 441, first conductive clip 470 and second conductive clip 471 have increased overall size compared to conductive clip 240 of FIG. 2 and top leadframe segment 360 of FIG. 3. As a result, first conductive clip 470 and second conductive clip 471 provide a low resistance, high current path for the coupling of sync transistor 442 and control transistor 443 to substrate 441.

First conductive clip 470 has thickness t5 and second conductive clip 471 has thickness t7. In some implementations, thickness t5 and thickness t7 are substantially the same thickness to allow for continuity in package height. In some implementations, thickness t5 and thickness t7 are a similar thickness to thickness t3 of top leadframe segment 360 of FIG. 3 and consequently provide similar advantages as thickness t3 of top leadframe segment 360 over conductive clip 240 of FIG. 2, as discussed above. For example, the increase of thickness t5 and thickness t7 does not require an increase in overall package height of power semiconductor package 400d compared to power semiconductor package 200 of FIG. 2, because the space increase within power semiconductor package 400d due to thickness t6 being less than thickness t2 of leadframe segment 245, leadframe segment 246, and leadframe segment 247 in FIG. 2 is used to increase thickness t5 of first conductive clip 470 and thickness t7 of second conductive clip 471. In some implementations, thickness t5 and thickness t7 may be determined such that the overall height of power semiconductor package 400d is less than the overall height of power semiconductor package 200 of FIG. 2. In such an implementation, the overall size of power semiconductor package 400d is decreased compared to power semiconductor package 200 in addition to an increase of the current carrying capability of first conductive clip 470 and second conductive clip 471 compared to the current carrying capability of conductive clip 240.

Sync transistor 442 of FIG. 4D is configured to be mechanically and electrically coupled to partially etched leadframe segment 462, partially etched leadframe segment 463, and first conductive clip 470. Sync transistor 442 may be a field-effect transistor (FET), insulated gate bipolar transistor (IGBT), or a high electron mobility transistor (HEMT), for example. More specifically, sync transistor 442 may be a silicon FET or a gallium nitride (GaN) FET.

Sync transistor 442 includes a source electrode, a drain electrode, and a gate electrode. The configuration of the source electrode, the drain electrode, and the gate electrode may be similar to that of sync transistor 442 of FIG. 4A. For example, in an implementation of power semiconductor package 400d using the configuration of sync transistor 442 of FIG. 4A, the source electrode may be source 492, the gate electrode may be gate 493, and the drain electrode may be drain 491. In such an implementation, first conductive clip 470 is electrically and mechanically coupled to drain 491, partially etched leadframe segment 462 is electrically and mechanically coupled to source 492, and partially etched leadframe segment 463 is electrically and mechanically coupled to gate 493.

Control transistor 443 of FIG. 4D is configured to be mechanically and electrically coupled to partially etched leadframe segment 464, first conductive clip 470, and second conductive clip 471. Control transistor 443 may be a field-effect transistor (FET), insulated gate bipolar transistor (IGBT), or a high electron mobility transistor (HEMT), for example. More specifically, control transistor 443 may be a silicon FET or a gallium nitride (GaN) FET.

Control transistor 443 includes a source electrode, a drain electrode, and a gate electrode. The configuration of the source electrode, the drain electrode, and the gate electrode may be similar to that of control transistor 443 of FIG. 4B. For example, in an implementation of power semiconductor package 400d using the configuration of control transistor 443 of FIG. 4B, the source electrode may be source 494, the gate electrode may be gate 495, and the drain electrode may be drain 496. In such an implementation, first conductive clip 470 is electrically and mechanically coupled to source 494, second conductive clip 471 is electrically and mechanically coupled to gate 495, and partially etched leadframe segment 464 is electrically and mechanically coupled to drain 496.

Partially etched leadframe segment 462 of power semiconductor package 400d is configured to couple the source electrode of sync transistor 442 to substrate 441. Partially etched leadframe segment 462 is electrically and mechanically coupled to sync transistor 442 by conductive adhesive 451. Partially etched leadframe segment 462 is also electrically and mechanically coupled to substrate 441 using a leadframe pad or a conductive adhesive, for example. Partially etched leadframe segment 462 may include a metal, such as copper, aluminum, or tungsten, a metal alloy, a tri-metal or other conductive material.

Partially etched leadframe segment 463 of power semiconductor package 400d is configured to couple the gate electrode of sync transistor 442 to substrate 441. Partially etched leadframe segment 463 is electrically and mechanically coupled to sync transistor 442 by conductive adhesive 453. Partially etched leadframe segment 463 is also electrically and mechanically coupled to substrate 441 using a leadframe pad or a conductive adhesive, for example. Partially etched leadframe segment 463 may include a metal, such as copper, aluminum, or tungsten, a metal alloy, a tri-metal or other conductive material.

Partially etched leadframe segment 464 of power semiconductor package 400d is configured to couple the drain electrode of control transistor 443 to substrate 441. Partially etched leadframe segment 464 is electrically and mechanically coupled to control transistor 443 by conductive adhesive 455. Partially etched leadframe segment 464 is also electrically and mechanically coupled to substrate 441 using a leadframe pad or a conductive adhesive, for example. Partially etched leadframe segment 464 may include a metal, such as copper, aluminum, or tungsten, a metal alloy, a tri-metal or other conductive material.

Partially etched leadframe segment 462, partially etched leadframe segment 463, and partially etched leadframe segment 464 have substantially the same thickness t6 that is dependent on a number of factors. Thickness t6 must allow for mechanical and electrical coupling between sync transistor 442 and each of first conductive clip 470, partially etched leadframe 462 and partially etched leadframe 463. Thickness t6 must further allow for mechanical and electrical coupling between control transistor 443 and each of first conductive clip 470, second conductive clip 471, and partially etched leadframe 464.

Similar to the differences between thickness t4 of FIG. 3 and thickness t2 of FIG. 2 discussed above, thickness t6 of partially etched leadframe segment 462, partially etched leadframe segment 463, and partially etched leadframe segment 464 are less than thickness t2 of leadframe segment 242 of FIG. 2. As a result, thickness t5 of first conductive clip 470 and thickness t7 of second conductive clip 471 can be increased compared to thickness t1 of conductive clip 240, resulting in a higher current carrying capability. Additionally, thickness t6 allows for a reduction in the overall package height of power semiconductor package 400d compared to power semiconductor package 200 of FIG. 2.

Conductive adhesive 450, conductive adhesive 451, conductive adhesive 453, conductive adhesive 454, conductive adhesive 455, and conductive adhesive 456 of power semiconductor package 400d may include a conductive adhesive material, a solder paste, solder tape, solder, a silver filled adhesive such as QMI 529HT, or another attachment means.

Substrate 441 includes a plurality of portions configured to electrically couple to the power electrodes and gate electrodes of power semiconductor package 400d. First conductive clip 470, second conductive clip 471, partially etched leadframe segment 462, partially etched leadframe segment 463, and partially etched leadframe segment 464 are electrically and mechanically coupled to substrate 441 using conductive pads or a conductive adhesive, for example. Substrate 441 may be a circuit board, for example a printed circuit board (PCB), or another suitable substrate.

Substrate 441 uses conductive traces or other conductive means to electrically couple the required components of power semiconductor package 400d. Substrate 441 may include conductive traces to electrically couple each of the source electrodes, the gate electrodes, and the drain electrodes of sync transistor 442 and control transistor 443 according to the exemplary circuit suitable for use as a voltage converter of FIG. 1.

According to the present disclosure, by using partially etched leadframe segment 462, partially etched leadframe segment 463, and partially etched leadframe segment 464 to couple sync transistor 442 and control transistor 443 to substrate 441, and by coupling first conductive clip 470 and second conductive clip 471 to substrate 441 without using a leadframe, power semiconductor package 400d achieves increased current carrying capability and reduced electrical resistance, form factor, complexity, and cost when compared to other packaging techniques using additional leadframes in combination with conductive clips, such as conductive clip 240 and leadframe segment 244 of FIG. 2. Additionally, the large surface area provided by first conductive clip 470 and second conductive clip 471 allows for more efficient input and output current conduction.

FIG. 4E illustrates a cross-sectional view of an exemplary power semiconductor package, in accordance with one implementation of the present disclosure. More specifically, FIG. 4E illustrates the power semiconductor package of FIG. 4D further including integrated circuit (IC) 475. Power semiconductor package 400e of FIG. 4E includes partially etched leadframe segment 462, partially etched leadframe segment 463, partially etched leadframe segment 464, partially etched leadframe segment 465, partially etched leadframe segment 466, sync transistor 442, control transistor 443, first conductive clip 470, wire bond 467, wire bond 468, integrated circuit 475, conductive adhesive 450, conductive adhesive 451, conductive adhesive 453, conductive adhesive 454, conductive adhesive 455, conductive adhesive 456, conductive adhesive 457, conductive adhesive 458, conductive adhesive 459, conductive adhesive 476, and substrate 441.

It should be noted with respect to FIG. 4E that partially etched leadframe segment 462, partially etched leadframe segment 463, partially etched leadframe segment 464, sync transistor 442, control transistor 443, first conductive clip 470, conductive adhesive 450, conductive adhesive 451, conductive adhesive 453, conductive adhesive 454, conductive adhesive 455, and substrate 441 correspond respectively to partially etched leadframe segment 462, partially etched leadframe segment 463, partially etched leadframe segment 464, sync transistor 442, control transistor 443, first conductive clip 470, conductive adhesive 450, conductive adhesive 451, conductive adhesive 453, conductive adhesive 454, conductive adhesive 455, and substrate 441 of FIG. 4D.

Integrated circuit 475 of power semiconductor package 400e is configured to be coupled between control transistor 443 and partially etched leadframe segment 466. More specifically, integrated circuit 475 is configured to be electrically coupled to the gate electrode of control transistor 443 using wire bond 467 and electrically coupled to partially etched leadframe segment 466 using wire bond 468. In addition, integrated circuit is configured to be electrically and mechanically coupled to partially etched leadframe segment 465 using conductive adhesive 459. Ultimately, because partially etched leadframe segment 466 is coupled to the gate electrode of sync transistor 442 using traces in substrate 441, for example, integrated circuit 475 is configured to control the gate electrodes of sync transistor 442 and control transistor 443 according to the exemplary circuit suitable for use as a voltage converter of FIG. 1.

Wire bond 467 of power semiconductor package 400e is configured to couple the gate electrode of control transistor 443 to integrated circuit 475. Wire bond 467 is coupled to the gate electrode of control transistor 443 using conductive adhesive 456 and is coupled to integrated circuit 475 using conductive adhesive 457.

Wire bond 468 is configured to couple integrated circuit 475 to partially etched leadframe segment 466. Wire bond 468 is coupled to integrated circuit 475 using conductive adhesive 458 and is coupled to partially etched leadframe segment 466 using conductive adhesive 476.

Power semiconductor package 400e of FIG. 4E includes similar features as power semiconductor package 400d of FIG. 4D and therefore shares similar performance benefits to those of power semiconductor package 400d discussed above.

FIG. 5A illustrates a simplified cross-sectional view of a power transistor for use in a power semiconductor package. Sync transistor 542 of FIG. 5A includes drain 591, source 592, and gate 593. Drain 591 is a power electrode situated on a top surface of sync transistor 542. Source 592 is a power electrode situated on a bottom surface of sync transistor 542. Gate 593 is a gate electrode situated on the bottom surface of sync transistor 542. In some implementations, sync transistor 542 of FIG. 5C and FIG. 5D discussed below has the same drain, source, and gate configuration of sync transistor 542 of FIG. 5A.

FIG. 5B illustrates a simplified cross-sectional view of another power transistor for use in a power semiconductor package. Control transistor 543 of FIG. 5B includes source 597, gate 599, and drain 598. Source 597 is a power electrode situated on a top surface of control transistor 543. Drain 598 is a power electrode situated on a bottom surface of control transistor 543. Gate 599 is a gate electrode situated on the bottom surface of control transistor 543. In some implementations, control transistor 543 of FIG. 5C and FIG. 5D discussed below has the same drain, source, and gate configuration of control transistor 543 of FIG. 5B.

FIG. 5C illustrates a top view of an exemplary power semiconductor package, in accordance with one implementation of the present disclosure. Power semiconductor package 500c of FIG. 5C includes partially etched leadframe segment 562, partially etched leadframe segment 563, partially etched leadframe segment 581, partially etched leadframe segment 582, sync transistor 542, control transistor 543, conductive clip 580, and substrate 541.

Conductive clip 580 of power semiconductor package 500c is configured to couple sync transistor 542 and control transistor 543 to substrate 541 without using a leadframe. More specifically, conductive clip 580 is configured to couple a drain electrode of sync transistor 542 and a source electrode of control transistor 543 to substrate 541. Conductive clip 580 is situated on a top surface of sync transistor 542 and control transistor 543. Conductive clip 580 may be electrically and mechanically coupled to sync transistor 542, control transistor 543, and substrate 541 using conductive adhesive such as solder, for example.

Additionally, conductive clip 580 may cover more or less surface area of sync transistor 542 and control transistor 543 than illustrated in FIG. 5C depending on the thermal and current carrying capability requirements of power semiconductor package 500c. In addition, conductive clip 580 may have a rectangular shape, as illustrated in FIG. 5C, or may have another suitable shape to maximize surface area within power semiconductor package 500c.

FIG. 5D illustrates a cross-sectional view of the exemplary power semiconductor package of FIG. 5C, in accordance with one implementation of the present disclosure. More specifically, FIG. 5D illustrates a cross-sectional view of power semiconductor package 500c along dashed line 5D-5D. Power semiconductor package 500d of FIG. 5D includes each feature of power semiconductor package 500c of FIG. 5C and further includes conductive adhesive 550, conductive adhesive 551, conductive adhesive 553, conductive adhesive 583, conductive adhesive 584, and conductive adhesive 585.

As stated above in reference to power semiconductor package 500c, conductive clip 580 is configured to couple the drain electrode of sync transistor 542 and the source electrode of control transistor 543 to substrate 541 without using a leadframe. Conductive clip 580 is configured to be electrically and mechanically coupled to sync transistor 542 using conductive adhesive 550. Conductive clip 580 is situated over and mechanically and electrically coupled to the drain electrode of sync transistor 542. Conductive clip 580 is configured to be electrically and mechanically coupled to control transistor 543 using conductive adhesive 583. Conductive clip 580 is situated over and mechanically and electrically coupled to the source electrode of control transistor 543. Conductive clip 580 is further configured to be electrically and mechanically coupled to substrate 541. Conductive clip 580 may include a metal such as copper, a metal alloy, or another highly conductive material.

As illustrated in FIG. 4D, conductive clip 580 extends to substrate 541 without using a leadframe. More specifically, both bottom surfaces 572 of conductive clip 580 are mechanically and electrically coupled to substrate 541 using a conductive adhesive, a conductive pad, or another suitable attachment material, for example.

Moreover, power semiconductor package 500d including conductive clip 580 provides several advantages over power semiconductor package 200 of FIG. 2 and power semiconductor package 300 of FIG. 3. Conductive clip 580 does not require an extra conductive adhesive or an additional leadframe, such as conductive adhesive 252, conductive adhesive 257, leadframe segment 244, and leadframe segment 248 of power semiconductor package 200 or conductive adhesive 352, conductive adhesive 357, leadframe segment 344, and leadframe segment 348 of power semiconductor package 300. As a result, manufacturing costs, complexity, and time for power semiconductor package 500d are reduced. In addition, no manufacturing tolerance is required for the application of a conductive adhesive on a leadframe, thus reducing the overall width of power semiconductor package 500d compared to power semiconductor package 200 and power semiconductor package 300.

Additionally, because conductive clip 580 extends to substrate 541 at both bottom surfaces 572, conductive clip 580 has increased size compared to conductive clip 240 of FIG. 2, top leadframe segment 360 of FIG. 3, and first conductive clip 470 of FIG. 4C, FIG. 4D, and FIG. 4E. As a result, conductive clip 580 provides a low resistance, high current path for the coupling of sync transistor 542 and control transistor 543 to substrate 541.

Conductive clip 580 has thickness t8. In some implementations, thickness t8 is a similar thickness to thickness t5 of first conductive clip 470 of FIG. 4D and consequently provides similar advantages as thickness t5 of first conductive clip 470 over conductive clip 240 of FIG. 2, as discussed above. For example, the increase of thickness t8 does not require an increase in overall package height of power semiconductor package 500d compared to power semiconductor package 200 of FIG. 2, because the space increase within power semiconductor package 500d due to thickness t9 being less than thickness t2 of partially etched leadframe segment 245, partially etched leadframe segment 246, and partially etched leadframe segment 247 in FIG. 2 is used to increase thickness t8 of conductive clip 580. In some implementations, thickness may be determined such that the overall height of power semiconductor package 500d is less than the overall height of power semiconductor package 200 of FIG. 2. In such an implementation, the overall size of power semiconductor package 500d is decreased compared to power semiconductor package 200 in addition to an increase of the current carrying capability of conductive clip 580 compared to the current carrying capability of conductive clip 240.

Sync transistor 542 of FIG. 5D is configured to be mechanically and electrically coupled to partially etched leadframe segment 562, partially etched leadframe segment 563, and conductive clip 580. Sync transistor 542 may be a field-effect transistor (FET), insulated gate bipolar transistor (IGBT), or a high electron mobility transistor (HEMT), for example. More specifically, sync transistor 542 may be a silicon FET or a gallium nitride (GaN) FET.

Sync transistor 542 includes a source electrode, a drain electrode, and a gate electrode. The configuration of the source electrode, the drain electrode, and the gate electrode may be similar to that of sync transistor 542 of FIG. 5A. For example, in an implementation of power semiconductor package 500d using the configuration of sync transistor 542 of FIG. 5A, the source electrode may be source 592, the gate electrode may be gate 593, and the drain electrode may be drain 591. In such an implementation, conductive clip 580 is electrically and mechanically coupled to drain 591, partially etched leadframe segment 562 is electrically and mechanically coupled to source 592, and partially etched leadframe segment 563 is electrically and mechanically coupled to gate 593.

Control transistor 543 of FIG. 5D is configured to be mechanically and electrically coupled to conductive clip 580, partially etched leadframe segment 581, and partially etched leadframe segment 582. Control transistor 543 may be a field-effect transistor (FET), insulated gate bipolar transistor (IGBT), or a high electron mobility transistor (HEMT), for example. More specifically, control transistor 543 may be a silicon FET or a gallium nitride (GaN) FET.

Control transistor 543 includes a source electrode, a drain electrode, and a gate electrode. The configuration of the source electrode, the drain electrode, and the gate electrode may be similar to that of control transistor 543 of FIG. 5B. For example, in an implementation of power semiconductor package 500d using the configuration of control transistor 543 of FIG. 5B, the source electrode may be source 597, the gate electrode may be gate 599, and the drain electrode may be drain 598. In such an implementation, conductive clip 580 is electrically and mechanically coupled to source 597, partially etched leadframe segment 582 is electrically and mechanically coupled to gate 599, and partially etched leadframe segment 581 is electrically and mechanically coupled to drain 598.

Partially etched leadframe segment 562 of power semiconductor package 500d is configured to couple the source electrode of sync transistor 542 to substrate 541. Partially etched leadframe segment 562 is electrically and mechanically coupled to sync transistor 542 by conductive adhesive 551. Partially etched leadframe segment 562 is also electrically and mechanically coupled to substrate 541 using a leadframe pad or a conductive adhesive, for example. Partially etched leadframe segment 562 may include a metal, such as copper, aluminum, or tungsten, a metal alloy, a tri-metal or other conductive material.

Partially etched leadframe segment 563 of power semiconductor package 500d is configured to couple the gate electrode of sync transistor 542 to substrate 541. Partially etched leadframe segment 563 is electrically and mechanically coupled to sync transistor 542 by conductive adhesive 553. Partially etched leadframe segment 563 is also electrically and mechanically coupled to substrate 541 using a leadframe pad or a conductive adhesive, for example. Partially etched leadframe segment 563 may include a metal, such as copper, aluminum, or tungsten, a metal alloy, a tri-metal or other conductive material.

Partially etched leadframe segment 581 of power semiconductor package 500d is configured to couple the drain electrode of control transistor 543 to substrate 541. Partially etched leadframe segment 581 is electrically and mechanically coupled to control transistor 543 by conductive adhesive 584. Partially etched leadframe segment 581 is also electrically and mechanically coupled to substrate 541 using a leadframe pad or a conductive adhesive, for example. Partially etched leadframe segment 581 may include a metal, such as copper, aluminum, or tungsten, a metal alloy, a tri-metal or other conductive material.

Partially etched leadframe segment 582 of power semiconductor package 500d is configured to couple the gate electrode of control transistor 543 to substrate 541. Partially etched leadframe segment 582 is electrically and mechanically coupled to control transistor 543 by conductive adhesive 585. Partially etched leadframe segment 582 is also electrically and mechanically coupled to substrate 541 using a leadframe pad or a conductive adhesive, for example. Partially etched leadframe segment 582 may include a metal, such as copper, aluminum, or tungsten, a metal alloy, a tri-metal or other conductive material.

Partially etched leadframe segment 562, partially etched leadframe segment 563, partially etched leadframe segment 581, and partially etched leadframe segment 582 have substantially the same thickness t9 that is dependent on a number of factors. Thickness t9 must allow for mechanical and electrical coupling between sync transistor 542 and each of conductive clip 580, partially etched leadframe 562, and partially etched leadframe 563. Thickness t9 must further allow for mechanical and electrical coupling between control transistor 543 and each of conductive clip 580, partially etched leadframe 581, and partially etched leadframe 582.

Similar to the differences between thickness t4 of FIG. 3 and thickness t2 of FIG. 2 discussed above, thickness t9 of partially etched leadframe segment 562, partially etched leadframe segment 563, partially etched leadframe segment 581, and partially etched leadframe segment 582 is less than thickness t2 of leadframe segment 242 of FIG. 2. As a result, thickness t8 of conductive clip 580 can be increased compared to thickness t1 of conductive clip 240, resulting in a higher current carrying capability. Additionally, thickness t9 allows for a reduction in the overall package height of power semiconductor package 500d compared to power semiconductor package 200 of FIG. 2.

Conductive adhesive 550, conductive adhesive 551, conductive adhesive 553, conductive adhesive 583, conductive adhesive 584, and conductive adhesive 585 of power semiconductor package 500d may include a conductive adhesive material, a solder paste, solder tape, solder, a silver filled adhesive such as QMI 529HT, or another attachment means.

Substrate 541 includes a plurality of portions configured to electrically couple to the power electrodes and gate electrodes of power semiconductor package 500d. Conductive clip 580, partially etched leadframe segment 562, partially etched leadframe segment 563, partially etched leadframe segment 581, and partially etched leadframe segment 582 are electrically and mechanically coupled to substrate 541 using conductive pads or a conductive adhesive, for example. Substrate 541 may be a circuit board, for example a printed circuit board (PCB), or another suitable substrate.

Substrate 541 uses conductive traces or other conductive means to electrically couple the required components of power semiconductor package 500d. Substrate 541 may include conductive traces to electrically couple each of the source electrodes, gate electrodes, and drain electrodes of sync transistor 542 and control transistor 543 according to the exemplary circuit suitable for use as a voltage converter of FIG. 1.

According to the present disclosure, by using partially etched leadframe segment 562, partially etched leadframe segment 563, partially etched leadframe segment 581, and partially etched leadframe segment 582 to connect sync transistor 542 and control transistor 543 to substrate 541, and by coupling conductive clip 580 to substrate 541 without using a leadframe, power semiconductor package 500d achieves increased current carrying capability and reduced electrical resistance, form factor, complexity, and cost when compared to other packaging techniques using additional leadframes in combination with conductive clips, such as conductive clip 240 and leadframe segment 244 of FIG. 2. Additionally, the large surface area provided by conductive clip 580 allows for more efficient input and output current conduction.

Moreover, conductive clip 580 further reduces electrical resistance, complexity, and cost of power semiconductor package 500d compared to power semiconductor package 400d of FIG. 4D. For example, power semiconductor package 500d only requires conductive clip 580 compared to first conductive clip 470 and second conductive clip 471 of power semiconductor package 400d. In addition, because conductive clip 580 is coupled to substrate at both bottom surfaces 572, electrical coupling to conductive clip 580 can be made on both sides of power semiconductor package 500d compared to power semiconductor package 400d which only allows electrical coupling to first conductive clip 470 on a single side.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor package comprising:
a sync transistor having a drain on a top surface of said sync transistor, and a source and a gate on a bottom surface of said sync transistor;
said source of said sync transistor configured for attachment to a first partially etched leadframe segment and said gate of said sync transistor configured for attachment to a second partially etched leadframe segment;
a control transistor having a source and a gate on a top surface of said control transistor, and a drain on a bottom surface of said control transistor;
said drain of said control transistor configured for attachment to a third partially etched leadframe segment;
a first conductive clip that includes a vertical segment extending to a substrate and a horizontal segment that is perpendicular to said vertical segment and that is situated over said drain of said sync transistor and said source of said control transistor, said first conductive clip coupling said drain of said sync transistor and said source of said control transistor to said substrate by an end surface of said vertical segment without using a leadframe; and
a second conductive clip that includes a vertical segment extending to said substrate and a horizontal segment that is perpendicular to said vertical segment and that is situated over and coupled to said gate of said control transistor, said second conductive clip coupling said gate of said control transistor to said substrate by an end surface of said vertical segment without using a leadframe.

2. The power semiconductor package of claim 1, wherein said first partially etched leadframe segment, said second partially etched leadframe segment, and said third partially etched leadframe segment are configured for attachment to said substrate.

3. The power semiconductor package of claim 1, wherein said sync transistor and said control transistor are selected from the group consisting of a FET, an IGBT, and a HEMT.

4. The power semiconductor package of claim 1, wherein said sync transistor and said control transistor are selected from the group consisting of a silicon FET and a GaN FET.

5. The power semiconductor package of claim 1, wherein said substrate is a circuit board.

6. The power semiconductor package of claim 1, wherein said sync transistor and said control transistor are part of a voltage converter.

7. A power semiconductor package comprising:
a sync transistor having a drain on a top surface of said sync transistor, and a source and a gate on a bottom surface of said sync transistor;
said source of said sync transistor attached to a first partially etched leadframe segment and said gate of said sync transistor attached to a second partially etched leadframe segment;
a control transistor having a source and a gate on a top surface of said control transistor, and a drain on a bottom surface of said control transistor;
said drain of said control transistor attached to a third partially etched leadframe segment;
a first conductive clip that includes a vertical segment extending to a substrate and a horizontal segment that is perpendicular to said vertical segment and that is situated over said drain of said sync transistor and said source of said control transistor, said first conductive clip coupling said drain of said sync transistor and said source of said control transistor to said substrate at an end surface of said vertical segment without using a leadframe;
a second conductive clip that includes a vertical segment extending to said substrate and a horizontal segment that is perpendicular to said vertical segment and that is situated over and coupled to said gate of said control transistor, said second conductive clip coupling said gate of said control transistor to said substrate by an end surface of said vertical segment without using a leadframe; and
an integrated circuit attached to a fourth partially etched lead frame segment, said integrated circuit coupled to said gate of said control transistor and to said gate of said sync transistor.

8. The power semiconductor package of claim 7, wherein said integrated circuit is coupled to said gate of said sync transistor by traces on said substrate.

9. The power semiconductor package of claim 7, wherein said sync transistor and said control transistor are selected from the group consisting of a FET, an IGBT, and a HEMT.

10. The power semiconductor package of claim 7, wherein said sync transistor and said control transistor are selected from the group consisting of a silicon FET and a GaN FET.

11. The power semiconductor package of claim 7, wherein said substrate is a circuit board.

12. The power semiconductor package of claim 7, wherein said sync transistor, said control transistor, and said integrated circuit are part of a voltage converter.

13. A power semiconductor package comprising:
a plurality of leadframe segments;
a first conductive clip of a power converter, wherein the first conductive clip includes a vertical segment and a horizontal segment;
a second conductive clip of the power converter, wherein the second conductive clip includes a vertical segment and a horizontal segment;
a sync transistor of the power converter, wherein a source node of the sync transistor is mechanically coupled to a first leadframe segment of the plurality of leadframe segments, a gate node of the sync transistor is mechanically coupled to a second leadframe segment of the plurality of leadframe segments and a drain node of the sync transistor is mechanically coupled to the first conductive clip along a surface thereof;
a control transistor of the power converter, wherein a source node of the control transistor is mechanically coupled to the first conductive clip along the surface thereof, a gate node of the control transistor is mechanically coupled to the second conductive clip along a surface thereof and a drain node of the control transistor is mechanically coupled to a third leadframe segment of the plurality of leadframe segments; and
an integrated circuit of the power converter, wherein the integrated circuit is mechanically coupled to a fourth leadframe segment of the plurality of leadframe segments, and is electrically coupled to the gate node of the sync transistor and to the gate node of the control transistor;
wherein the vertical segment of the first conductive clip is configured to extend to a substrate and electrically couple the drain node of the sync transistor and the source node of the control transistor to the substrate by an end surface of the vertical segment of the first conductive clip that is perpendicular to a long axis of the vertical segment of the first conductive clip.

14. The power semiconductor package of claim 13, wherein the vertical segment of the second conductive clip is configured to extend to the substrate and electrically couple the gate node of the control transistor to the substrate by an end surface of the vertical segment of the second conductive clip that is perpendicular to a long axis of the vertical segment of the second conductive clip.

15. The power semiconductor package of claim 14, wherein the vertical segment of the first conductive clip is mechanically coupled to the substrate by the end surface of the vertical segment of the first conductive clip, and wherein the vertical segment of the second conductive clip is mechanically coupled to the substrate by the end surface of the vertical segment of the second conductive clip.

* * * * *